(12) United States Patent
Leonowich et al.

(10) Patent No.: US 6,172,634 B1
(45) Date of Patent: Jan. 9, 2001

(54) METHODS AND APPARATUS FOR PROVIDING ANALOG-FIR-BASED LINE-DRIVER WITH PRE-EQUALIZATION

(75) Inventors: Robert H. Leonowich, Muhlenberg Township; Omid Shoaei, Allentown; Ayal Shoval, Whitehall, all of PA (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/030,276

(22) Filed: Feb. 25, 1998

(51) Int. Cl.$^7$ ........................................... H03M 1/80
(52) U.S. Cl. ................................. 341/153; 341/70
(58) Field of Search ........................ 341/70, 136, 143, 341/144, 153

(56) References Cited

U.S. PATENT DOCUMENTS

| | | | |
|---|---|---|---|
| 3,543,009 | * 11/1970 | Voelcker, Jr. | 341/143 |
| 5,267,269 | * 11/1993 | Shih et al. | 375/60 |
| 5,651,029 | * 7/1997 | Yang et al. | 375/296 |
| 5,771,237 | * 6/1998 | Kao | 375/257 |
| 5,995,555 | * 11/1999 | Young | 375/296 |

FOREIGN PATENT DOCUMENTS 0 673 139 A2 * 9/1995 (EP) .

OTHER PUBLICATIONS

Lucent Technologies Microelectronics Group "ATT1MX10 (Spinnaker) Quad MAC and Transceivers" Data Sheet, pp. 45–47, Aug. 1997.
Su et al., ACMOS oversampling D/A coverter with a current mode semi–digital reconstruction filter, IEEE International Solid State Circuits Conference, 1993, Feb. 24–26, 1993, Digest of Technical Papers pp. 230–231.*

* cited by examiner

*Primary Examiner*—Howard L. Williams
(74) *Attorney, Agent, or Firm*—Law Offices of Peter H. Priest, PLLC

(57) ABSTRACT

A line-driver receives as an input a Manchester-encoded digital data signal, which is then converted into an analog signal by a wave-shaping circuit. The wave-shaping circuit comprises a bank of current sources with a combined output, each current source being actuated by a switch controlled by a switching signal. The current sources are each scaled by a coefficient, and are actuated in a selected sequence during each input data pulse, thereby generating as a combined output a staircase pulse signal with n steps for each input data pulse.

24 Claims, 8 Drawing Sheets

METHODS AND APPARATUS FOR PROVIDING ANALOG-FIR-BASED LINE-DRIVER WITH PRE-EQUALIZATION

BACKGROUND OF THE INVENTION

1. Field of the Invention

The present invention relates generally to improvements in analog finite impulse response (FIR) based line-drivers, and more particularly to advantageous aspects of an analog-FIR-based filter embedded in a line-driver, by which wave-shaping, filtering and pre-equalization for the data stream are implemented.

2. Description of the Prior Art

According to the international standard ISO/IEC 8802-3 (ANSI/IEEE std 802-3, clause 14.3.1.2.1), any harmonics of a transmitted signal for an all-ones Manchester (return-to-zero) encoded signal have to be at least 27 dB below the fundamental, which in a 10 Base-T system is 10 MHz. For a 5 MHz signal (periodic "10" or "01" binary data), the high-frequency components of the signal have to be enhanced, thus increasing the transmission distance. This is typically called "pre-equalization." The amount of the pre-equalization should be such that the eye-diagram of the signal at the output of the twisted-pair model (ISO 8802.3) stays inside the voltage template shown in FIG. 14–9 of ISO 8802-3. In addition, it is required that the signal amplitude for a 100 Ω resistive load stay between 2.2 V to 2.8 V (i.e., 2.5 V±12%).

FIG. 1 shows a known configuration, in which the preceding requirements are met by a four-pin driver requiring four off-chip resistors and a differential off-chip filter (ATT1MX10 data sheet, August 1997). It is possible to integrate the transmit filters onto the chip by using continuous-time techniques, such as a Gm-C filter technique. However, the cut-off frequencies of continuous-time filters move from their desired value due to process and temperature conditions. To maintain the cut-off frequency of the continuous-time filter, a process plus temperature tuning mechanism has to be employed. Furthermore, designing a continuous-time filter to accommodate a large output swing (5 V peak-to-peak±12%) with a power supply of 5 V±10% is very difficult and expensive. In addition, to accommodate the pre-equalization, a second parallel continuous-time filter is required, or at least the input-stage of the filter has to be replicated. This has the disadvantage of increasing the power consumption of the driver.

SUMMARY OF THE INVENTION

The present invention integrates an analog finite impulse response (FIR) filter and a pre-equalization function for high-speed data communication. These functions are advantageously embedded within a line driver.

In a preferred embodiment, the line-driver receives as an input a Manchester-encoded digital data signal, which is then converted into an analog signal by a wave-shaping circuit. The wave-shaping circuit comprises a bank of current sources with a combined output, each current source being actuated by a switch controlled by a switching signal. The current sources are each scaled by a coefficient, and are actuated in a selected sequence during each input data pulse, thereby generating as a combined output a staircase pulse signal with n steps for each input data pulse.

DETAILED DESCRIPTION

The disclosure in Barraclough, U.S. Pat. No. 5,739,707, issuing from U.S. patent application Ser. No. 08/685,080, owned by the same assignee as the present invention, is hereby incorporated by reference.

Figure 1:
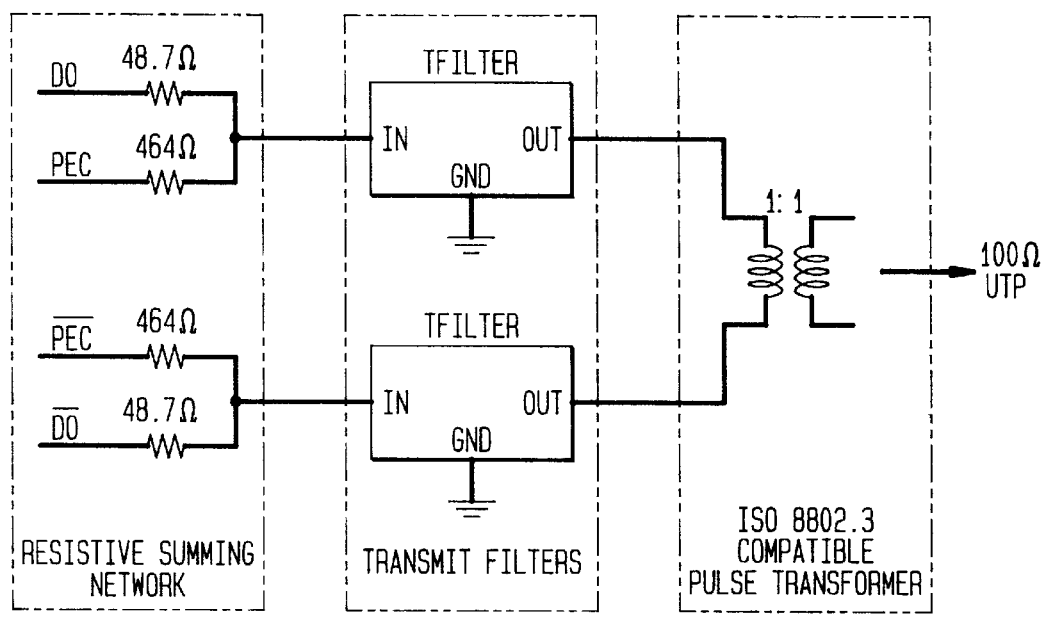
FIG. 1 shows a diagram of a prior-art four-pin line driver.
Figure 2:
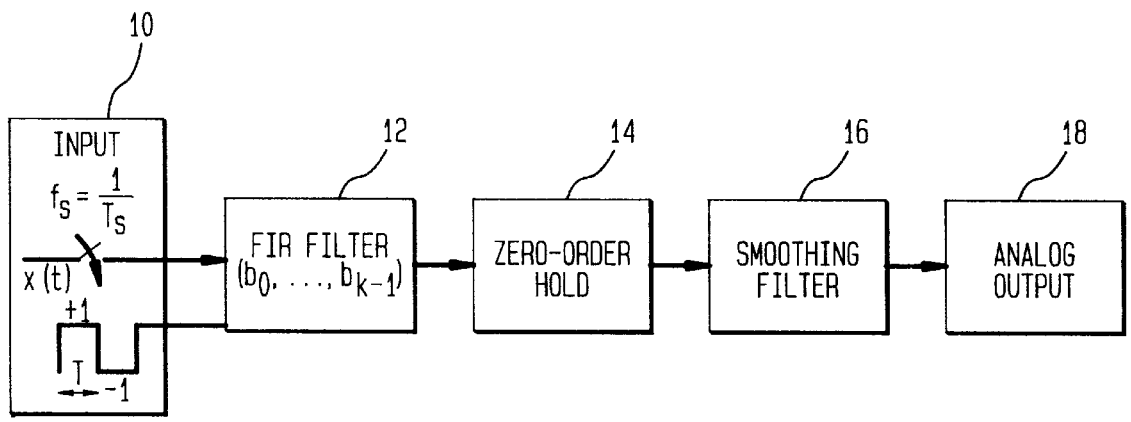
FIG. 2 shows a diagram of a model of the wave-shaping and filtering blocks for a line driver according to the present invention.

FIG. 2 shows a model for an analog-FIR-based filter according to the present invention for use in a 10 Base-T driver. The input 10 to the filter is signal x(t), which is Manchester-encoded bipolar (±1) pulse, which is a bipolar representation for digital HIGH and LOW levels (hereafter represented as HI and LO) for the input signal. FIR filter 12, combined with zero-order hold circuit 14, generates as an output a staircase pulse with $T_s$ sec time intervals (resolution) from each Manchester-encoded pulse. The wave-shaped signal travels through n steps from 0 V to +1 V or to −1 V (normalized) at the start of transmission. Then, depending on the input data, the signal can travel from one peak to another through n steps within a 50 ns period. Alternatively, the signal can experience some droop for pre-equalization, as discussed below. The staircase pulse signal output of the FIR filter 12 is then converted to a continuous waveform analog output 18 by a smoothing filter circuit 16.

The n-step levels are chosen such that the all-ones (or all-zeros) wave-shaped waveform resembles a 10 MHz sinusoidal waveform as follows:

$$a_k = \sin\left(2\pi f_o \cdot \frac{T}{2} \cdot \frac{k}{n}\right) = \sin\left(\frac{\pi k}{n}\right) \quad \text{(EQ 1)}$$

where
  k=0 to n−1

$$f_o = \frac{1}{T}$$

$f_o$ is the fundamental frequency of the waveform, i.e., the digital bit rate. For the 10 Base-T example, the fundamental frequency is 10 MHz (or a period of 100 ns).

Figure 3:
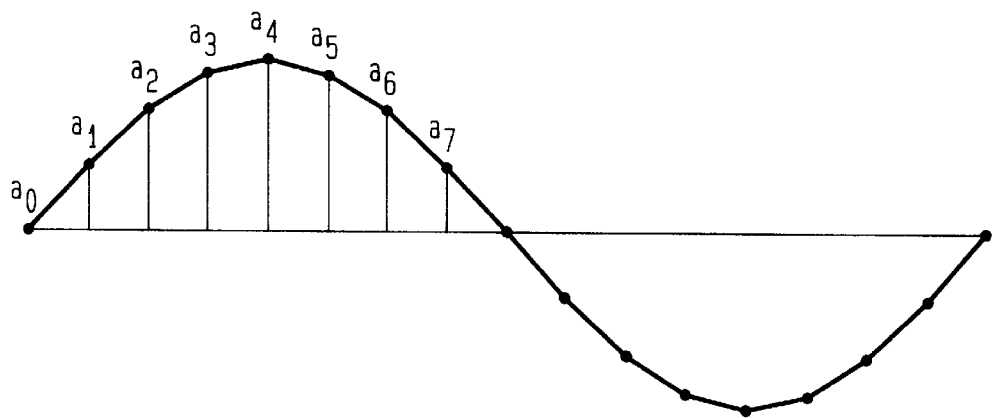
FIG. 3 shows a graph of the FIR filter output for the maximum Manchester-encoded input data pulse rate, i.e., where the input data is all-ones or all-zeros.

FIG. 3 shows a graph of outputs $a_0$–$a_7$ of the FIR filter, where n=8. From EQ 1, it can easily be shown that for n=8:

$$(a_0, a_1, a_2, a_3, a_4, a_5, a_6, a_7) = (0, 0.383, 0.7071, 0.9239, 1, 0.9239, 0.7071, 0.383) \quad \text{(EQ 2)}$$

where the $a_k$ coefficients represent the sinusoidal samples normalized to 1.0.

In a preferred embodiment of the present invention, the FIR coefficients $b_0$–$b_7$ required to generate outputs $a_0$–$a_7$ are derived as follows. As explained above, at the start of first transmission, the output signal travels from 0 V (rest condition) to +1 V or to −1 V (normalized) depending upon the polarity of the input Manchester pulse. Therefore, in steady state, the FIR coefficients are defined from the maximum peak value of the signal (normalized to 1). From FIG. 3 and EQ 1, the FIR coefficients, which are the difference of two subsequent samples, are derived as follows:

$$b_k = \sin\left(\frac{\pi}{2} + \frac{\pi k}{n}\right) - \sin\left(\frac{\pi}{2} + \frac{\pi(k+1)}{n}\right) \quad \text{(EQ 3)}$$

where k=0 to n−1

For n=8, i.e., in an 8-tap FIR, the coefficients are as follows:

$$(b_0, b_1, b_2, b_3, b_4, b_5, b_6, b_7) = (0.076, 0.217, 0.324, 0.383, 0.383, 0.324, 0.217, 0.076) \quad \text{(EQ 4)}$$

In a preferred embodiment of the present invention, the coefficients are hard placed by scaling of transistors in a current-steering digital-to-analog converter (DAC), using leg pairs to provide each required pulse level. Thus, the realized n-leg DAC coefficients are as follows:

$$c_k = \frac{1}{2} b_k \quad \text{(EQ 5)}$$

for k=0 to n−1

So, for n=8, we have $$(c_0, c_1, c_2, c_3, c_4, c_5, c_6, c_7) = (0.0380, 0.1085, 0.1620, 0.1915, 0.1915, 0.1620, 0.0185, 0.0380) \quad \text{(EQ 6)}$$

For all-ones or all-zeros data (10 MHz in 10 Base-T), where a +1 level follows a −1 level every cycle, starting from a peak level (+1 or −1) first the current in the $(c_0, c_7)$, $(c_1, c_6)$, $(c_2, c_5)$, and $(c_3, c_4)$ leg pairs of the DAC are turned off sequentially in order with $$T_S = \frac{1}{f_s} = \frac{T}{2n}$$

intervals. As defined above, T is the digital bit rate, i.e., 10 MHz, and n is the number of FIR taps. The leg pairs are then turned on in reverse order, i.e., the $(c_3, c_4)$, $(c_2, c_5)$, $(c_1, c_6)$, and $(c_0, c_7)$. It will be seen that the actuation of leg pairs in this sequence results in the desired outputs $a_0$–$a_7$. It should be noted that the polarity or sign of the signal changes at zero-crossings.

Figure 4:
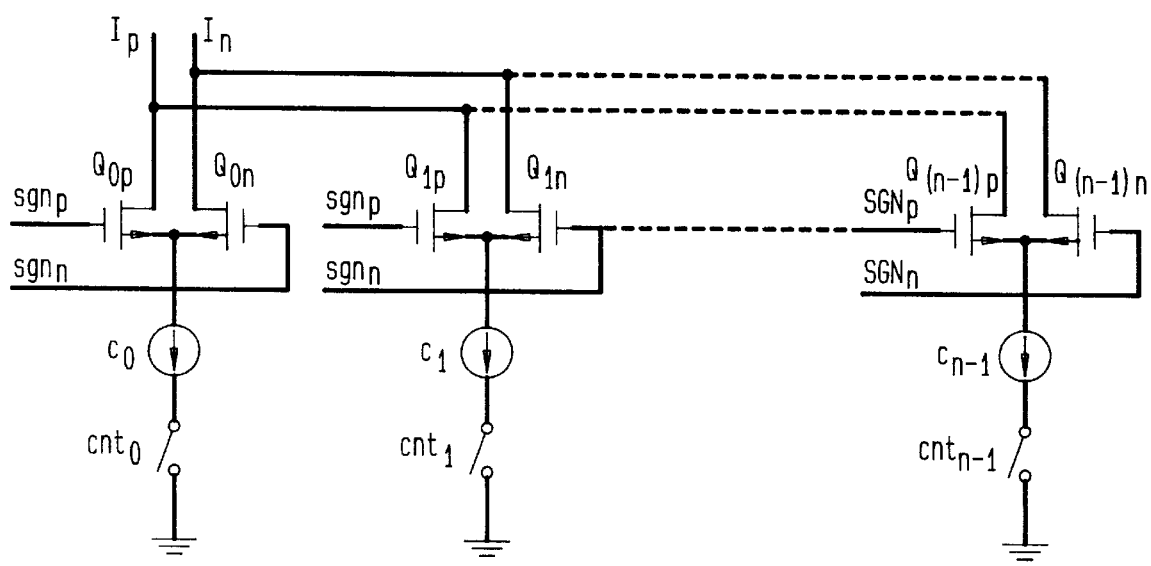
FIG. 4 shows the main structure of an FIR DAC according to the present invention, using only N-channel devices.

FIG. 4 shows one implementation of this current-steering DAC to implement the above-described FIR filter, with a main structure using only N-channel devices. The FIG. 4 circuit includes a bank of current sources $c_0$–$c_7$, which are turned on and off by associated NMOS transistors (shown as switches) controlled by signals $cnt_0$ to $cnt_{n-1}$. Tail currents $c_0$–$c_7$ of the DAC are scaled according to the coefficients given in EQ 5.

As further shown in FIG. 4, output selection circuitry is provided. The polarity of the Manchester-encoded pulse is changed by the sign signals represented by $sgn_p$ and $sgn_n$ in FIG. 4. The sign signals control differential FET pairs $Q_{0p}/Q_n$–$Q_{(n-1)p}/Q_{(n-1)n}$. Depending upon which FET is on, each current source provides one of two outputs, a positive output or a negative output. The circuit provides as a first output $I_p$ the combined positive outputs from the current sources and as a second output $I_n$ the combined negative outputs. The circuitry of FIG. 4 is typically implemented on an integrated circuit although other implementations are possible.

Figure 5:
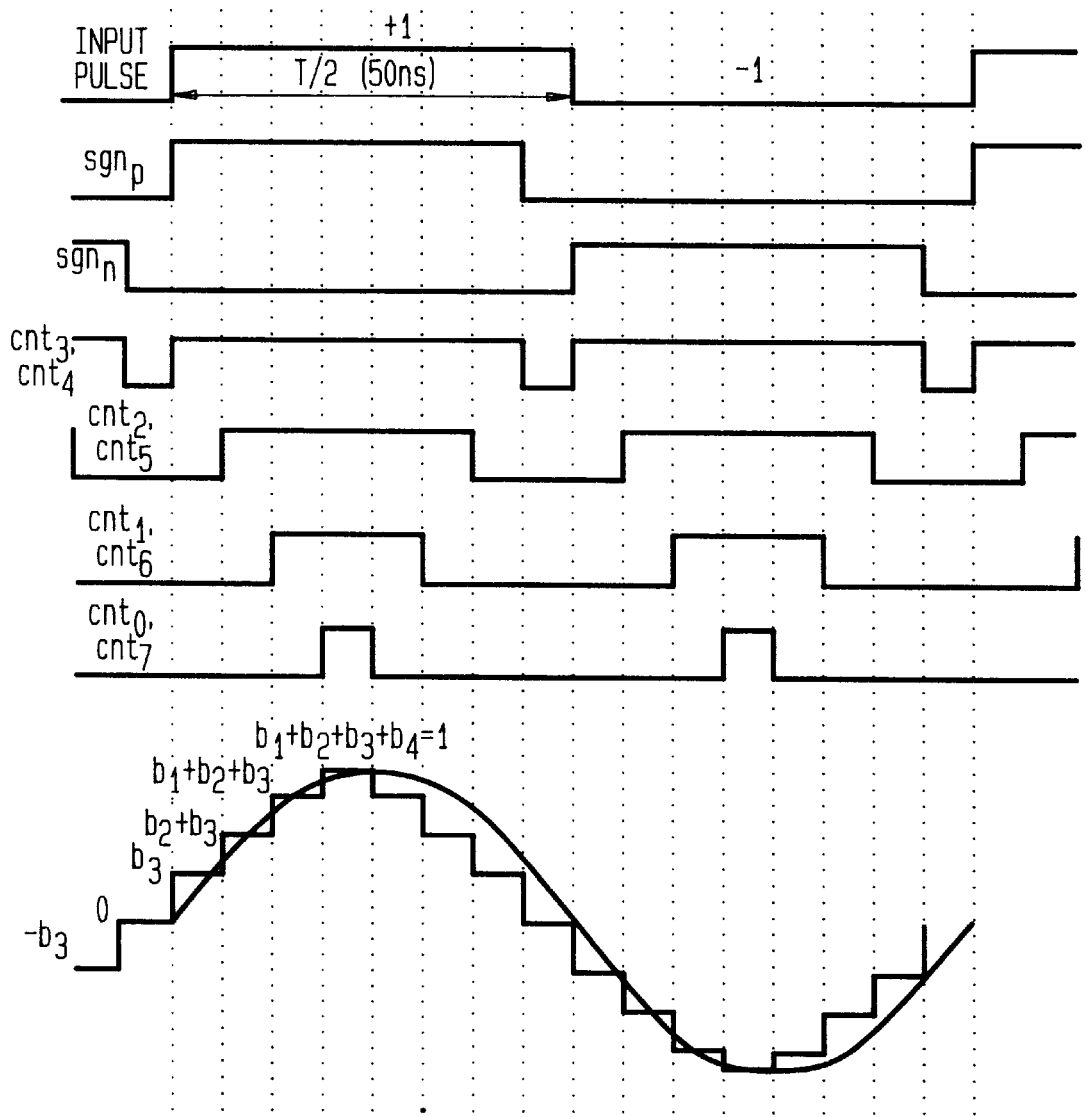
FIG. 5 shows a graph of the control signals for the circuit of FIG. 4 for generating the output shown in FIG. 3.

FIG. 5 shows a graph of the FIR DAC control signals that are used with the FIG. 4 to produce the desired sinusoidal output. The control signals are spaced by $$\frac{1}{f_s}$$

time intervals, for the case n=8. At the beginning of the cycle shown in the graph, the input pulse is +1 V (HI). Because the input pulse is positive, $sgn_p$ is on and $sgn_n$ is off. Control signals $cnt_0$-$cnt_7$ are actuated in pairs to effect the DAC leg-pair sequence described above. When the input pulse drops to −1 V (LO), $sgn_n$ is turned on. Note that, in order to achieve a more linear output signal (ideally sinusoidal), the sign signals are non-overlapping. Thus, $sgn_p$ is turned off one time interval before $sgn_n$ is turned on, and vice versa. Finally, it should be noted that the control signals shown in FIG. 5 are for the Manchester-encoded pulse representing all-ones (or all-zeros), i.e., the maximum frequency, and does not result in any pre-equalization.

Figure 6:
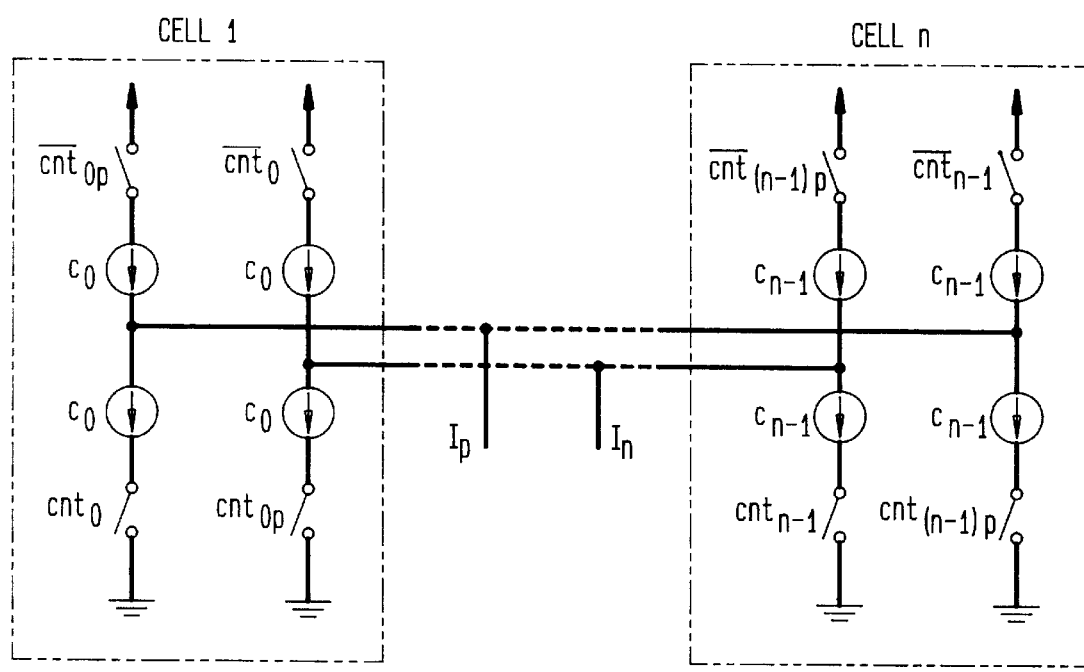
FIG. 6 shows an FIR DAC main circuit according to the present invention, using complementary P-channel and N-channel devices.

FIG. 6 shows another embodiment of the present invention, using both P-channel and N-channel devices. The use of both P-channel and N-channel devices eliminates the requirement for sign signals $sgn_p$ and $sgn_n$. However, in order to achieve a bipolar signal (±1) as shown in FIG. 6, a new set of control signals must be added. As shown in FIG. 6, for each $cnr_k$ control signal, it is necessary to generate a signal represented by $cnt_{kp}$ in which k is the coefficient index andp (for prime) is a label to distinguish this control signal from its $cnr_k$ counterpart. In order to control the P-channel devices, the inverted version of both original and prime control signals represented by $\overline{cnt}_k$ and $\overline{cnt}_{kp}$ must also be used. The control signals in FIG. 6 are such that the current in each cell always flows either from the top right current source (P-device) to the bottom left current source (N-device). It should be noted that all four current sources in each cell can be turned on at the same time; however, this increases power consumption.

Figure 7:
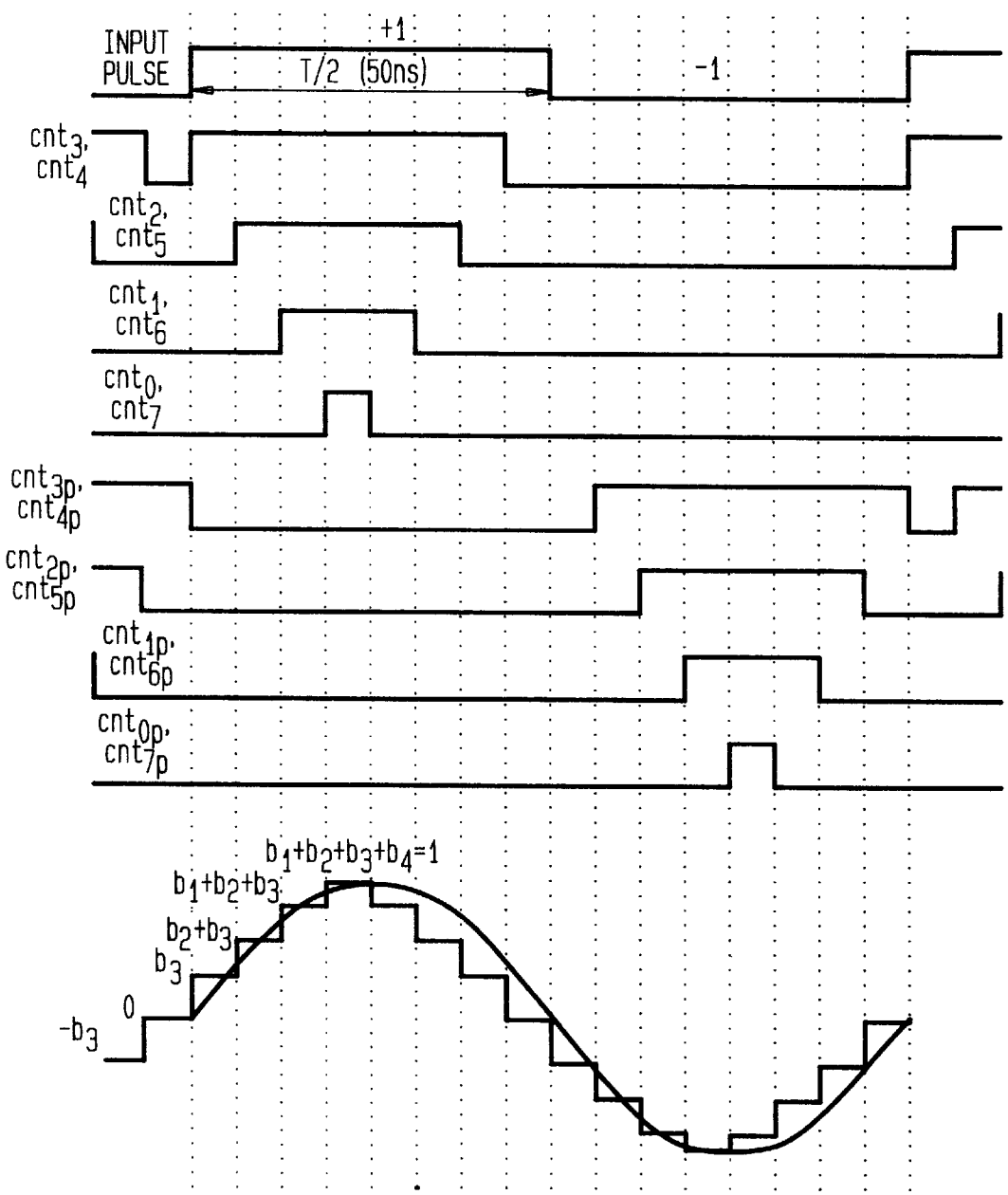
FIG. 7 shows a graph of the control signals for the circuit of FIG. 6 for generating the output shown in FIG. 3.

FIG. 7 shows a graph of the control signals in the P- and N-channel architecture shown in FIG. 6, again for the case n=8. The control signals shown in FIG. 7 are for the Manchester-encoded pulse representing all-ones (or all-zeros) Manchester-encoded data (i.e., the maximum frequency) and do not result in any pre-equalization. With reference to FIG. 7 and FIG. 5, it is apparent that combining control signals $cnt_k$ and $cnt_{kp}$ in FIG. 7 (complementary P- and N-channel structure) using an OR function results in control signal $cnt_k$ in FIG. 5 (N-channel structure only).

Thus far, it has been assumed that the input data is a Manchester-encoded pulse representing all-ones or all-zeros, which results in the period waveform shown in FIG.

5 (for the all N-channel structure shown in FIG. 4) or the one shown in FIG. 7 (for the complementary P- and N-channel structure shown in FIG. 6). But, as mentioned above, in order to increase the transmission distance, the present invention further provides a pre-equalization mechanism.

Figure 8:
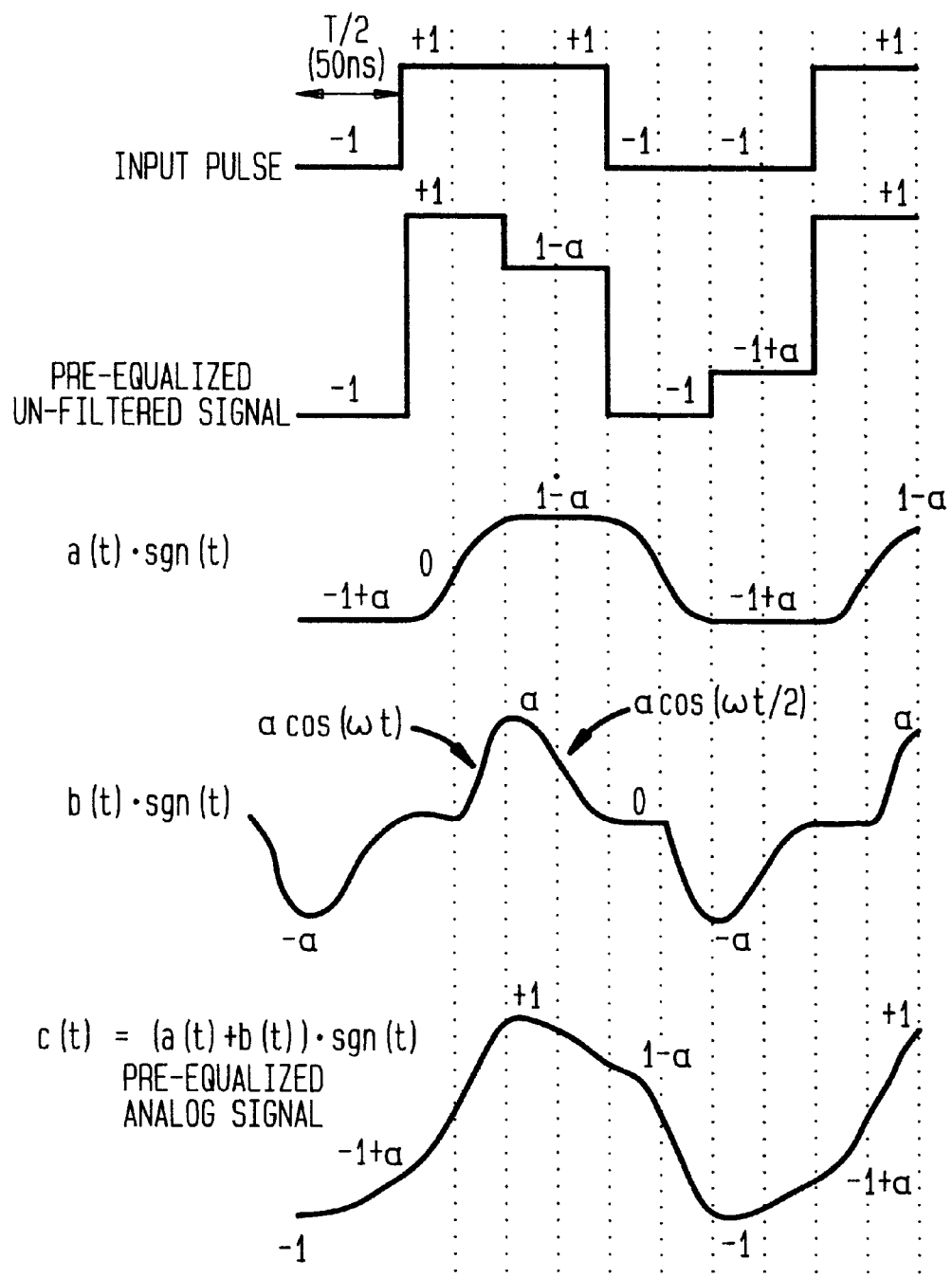
FIG. 8 shows a graph of a pre-equalization approach in according with the present invention.

FIG. 8 shows a pre-equalization technique according to the present invention, where some pre-equalization is produced by an arbitrary weight, α%. Where there are two consecutive identical input data pulse levels, the resultant unfiltered pre-equalized signal exhibits amplitude droop by the equalization weight, α%. When the consecutive identical data pulses are positive, this droop is from +1 to 1−α during the second repeated pulse level. When the input data pulses are negative, this droop is from −1 to −1+α. According to the present invention, the wave-shaping technique described above is used to generate first and second analog signals a(t) and b(t), which are each multiplied by sign signal sgn(t) and then summed to produce the desired pre-equalized analog signal c(t).

As shown in FIG. 8, signals a(t) and b(t) are periodic waveforms, having respective peak values of 1−α and α. Thus, the combined peak values of the waveforms a(t) and b(t) is 1 (normalized). Signal a(t) is shaped to make a sinusoidal peak-to-peak transition during the first of two consecutive input pulses, and then to hold the peak value for the second consecutive input pulse. Signal b(t) is shaped to have a zero value during the first half of the first input pulse, followed by a sinusoidal zero-to-peak transition during the second half of the first input pulse, and then a sinusoidal peak-to-zero transition during the second input pulse. Because all transitions in waveforms a(t) and b(t) are sinusoidal, the same FIR coefficients can be used to generate these waveforms as were used in the embodiments of the invention described above. Of course, as discussed below, changes must be made to the sequence in which the control signals are actuated.

Figure 9:
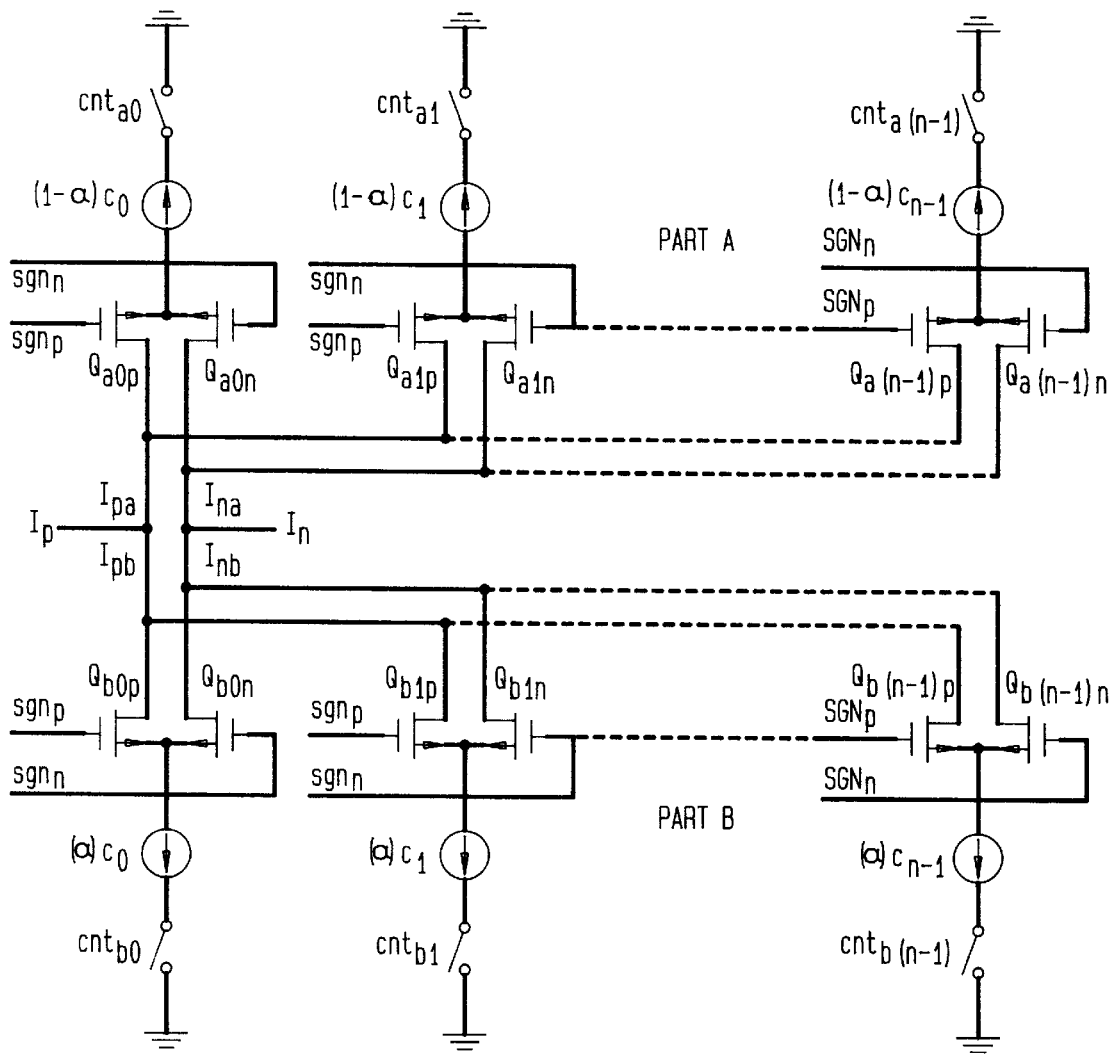
FIG. 9 shows an FIR DAC circuit according to the present invention for implementing the pre-equalization scheme shown in FIG. 8.

FIG. 9 shows a preferred embodiment of a circuit implementation for this method of producing pre-equalized analog signal c(t). The FIG. 9 circuit includes two sub-circuits, Part A and Part B. Each sub-circuit is similar to the circuit shown in FIG. 4, but with different current scaling. The FIG. 6 circuit, which includes complementary P-channel and N-channel current sources, can be used for the Part A and Part B sub-circuits as well. The Part A sub-circuit is used to generate analog signal a(t), and the Part B sub-circuit is used to generate analog signal b(t). The transistor sizes for Part A are scaled by a factor of 1−α. The transistor sizes for the Part B are scaled by a factor of α. For the special case where α=½ (i.e., 50% pre-equalization), Part A and Part B are identical, which makes the design and physical realization of the circuit much more straightforward. As shown in FIG. 9, both sub-circuits include output selection circuitry comprising FET pairs $Q_{a0p}/Q_{a0n}-Q_{a(n-1)p}/Q_{a(n-1)n}$ and $Q_{b0p}/Q_{b0n}-Q_{b(n-1)p}/Q_{b(n-1)n}$, which are used to separate the positive and negative outputs of the Part A and Part B sub-circuits, which are combined to produce outputs $I_p$ and $I_n$. Because Part A and Part B of the circuit each produce a fraction of the output current such that the total normalized peak current is 1, there is no excessive power consumption, as would be the case if one wanted to use a conventional continuous-time filter approach in which extra Gm-C filters or op-amps would be needed to accomplish the pre-equalization.

Figure 10:
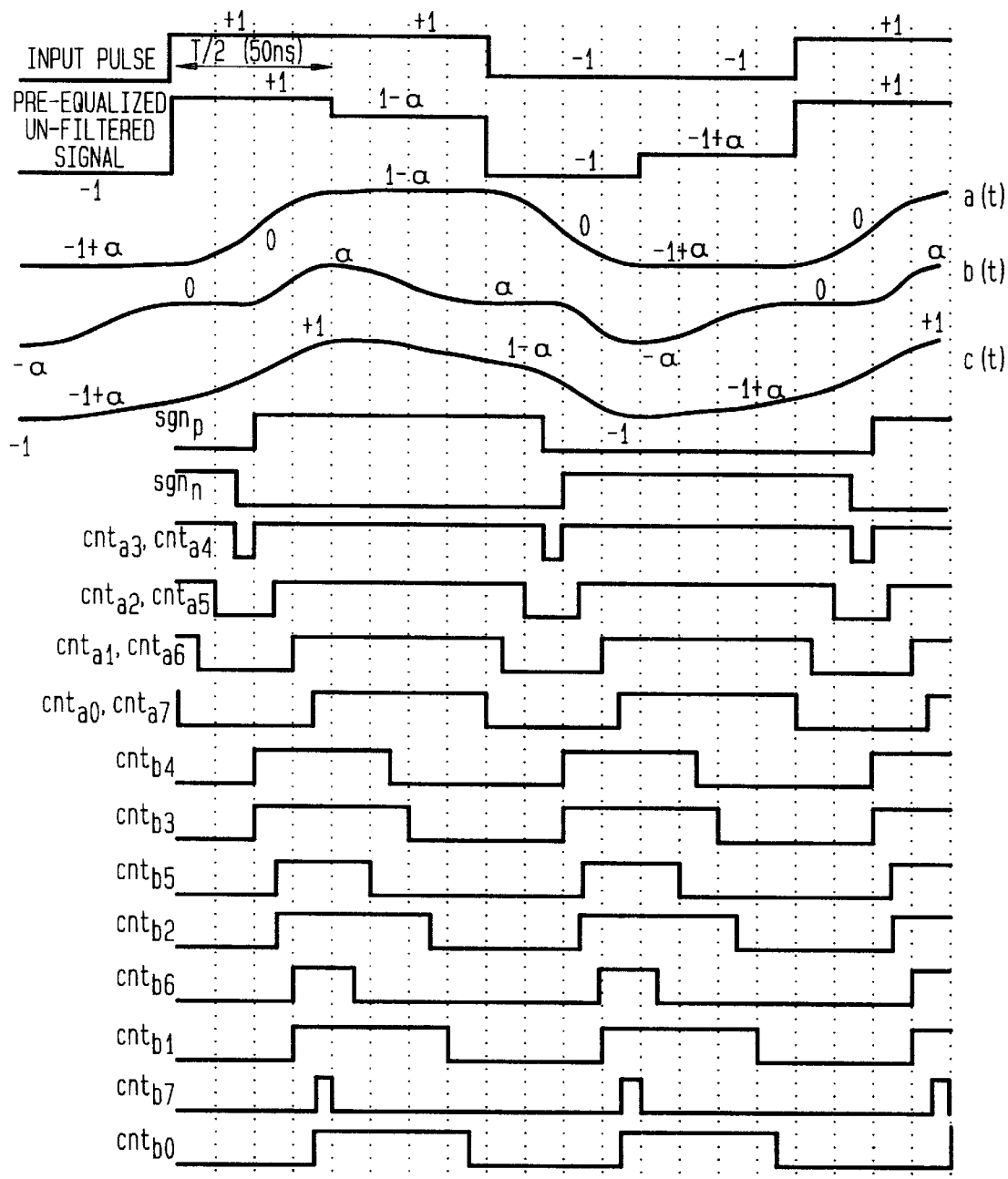
FIG. 10 shows a graph of the control signals for the FIG. 9 circuit for generating the pre-equalized output shown in FIG. 8.

FIG. 10 shows a graph of the control signals for pre-equalization for the waveform shown in FIG. 8, representing a 5 MHz period in 10 Base-T. As shown in FIG. 10, the control signals represented by $cnt_{ak}$ in the Part A and $cnt_{bk}$ in the Part B sub-circuits shown in FIG. 9 to generate signals a(t) and b(t) are different. However, their signs are the same, which simplifies the control method.

The method used for pre-equalization can be summarized, considering the following four cases:

Case 1: The level of the pulse switches from the previous level to the opposite level (+1→−1) or (−1→+1). This is the case of the Manchester-encoded pulse representing all-ones or all-zeros data.

Starting from a peak level, all control signals in both sub-circuits Part A and Part B are high. The control signals go off sequentially in order as follows (where ↑ and ↓ represent, respectively, a switch turning on or off):

($cnt_{a0}$, $cnt_{a7}$)↓, ($cnt_{a1}$, $cnt_{a6}$)↓, ($cnt_{a2}$, $cnt_{a5}$)↓, ($cnt_{a3}$, $cnt_{a4}$)↓

The control signals then turn on sequentially in reverse order:

($cnt_{a3}$, $cnt_{a4}$)↑, ($cnt_{a2}$, $cnt_{a5}$)↑, ($cnt_{a1}$, $cnt_{a6}$)↑, ($cnt_{a0}$, $cnt_{a7}$)↑

The sign control signals change at the zero-crossing point, i.e., for (+1→−1) transition $sgn_p$↓ and at the next step $sgn_n$↑ to guarantee the non-overlapping performance for the sign signals. The opposite action for the sign signal happens for (−1→+1) transition $sgn_n$↓ and at the next step $sgn_p$↑. It should be noted that for this case, every control signal in the Part B sub-circuit is identical to its counterpart in the Part A sub-circuit (i.e., $cnt_{ak}$ and $cnt_{bk}$ are alike).

Case 2: The level of the pulse is the same as the previous one (+1→+1) or (−1→−1). This is the case in which the pre-equalization must be working.

Starting from a peak level, all control signals in both sub-circuit Part A and sub-circuit Part B are high. The following events happen in the following sequence:

$cnt_{b7}$↓, $cnt_{b6}$↓, $cnt_{b5}$↓, $cnt_{b4}$↓, $cnt_{b3}$↓, $cnt_{b2}$↓, $cnt_{b1}$↓, $cnt_{b0}$↓

Then at the next step:

($cnt_{a0}$, $cnt_{a7}$)↓, ($cnt_{a1}$, $cnt_{a6}$)↓, ($cnt_{a2}$, $cnt_{a5}$)↓, ($cnt_{a3}$, $cnt_{a4}$)↓

Then, the sign control signals change at the zero-crossing point, as was described in Case 1.

Case 3: This case addresses the start of packet (start of transmissions), where the level of the pulse travels from zero (rest) to +1 or −1, i.e., (0→+1) or (0→−1).

Starting from zero level, both control signals in sub-circuit Part A and sub-circuit Part B are actuated in the following sequence:

($cnt_{a0}$, $cnt_{b0}$)↑, ($cnt_{a1}$, $cnt_{b1}$)↑, ($cnt_{a2}$, $cnt_{b2}$)↑, ($cnt_{a3}$, $cnt_{b3}$)↑, ($cnt_{a4}$, $cnt_{b4}$)↑, ($cnt_{a5}$, $cnt_{b5}$)↑, ($cnt_{a6}$, $cnt_{b6}$)↑, ($cnt_{a7}$, $cnt_{b7}$)↑

At the start of the transmission, the sign control signals are set accordingly. Basically, $sgn_p$↑ and $sgn_n$↓ for +1 and $sgn_p$↓ and $sgn_n$↑ for −1 occur simultaneously.

Case 4: This case addresses the end of packet (end of transmission), where the level of the pulse travels from +1 or −1 to zero (rest), i.e., (+1→0) or (−1→0).

Starting from either +1 or −1 level: both control signals in sub-circuit Part A and sub-circuit Part B are actuated in the following sequence:

($cnt_{a7}$, $cnt_{b7}$)↓, ($cnt_{a6}$, $cnt_{b6}$)↓, ($cnt_{a5}$, $cnt_{b5}$)↓, ($cnt_{a4}$, $cnt_{b4}$)↓, ($cnt_{a3}$, $cnt_{b3}$)↓, ($cnt_{a2}$, $cnt_{b2}$)↓, ($cnt_{a1}$, $cnt_{b1}$)↓, ($cnt_{a0}$, $cnt_{b0}$)↓

The sign control signals stay unchanged.

Every other event of data is a subset of the four cases described above and can be derived accordingly.

While the foregoing description includes detail which will enable those skilled in the art to practice the invention, it should be recognized that the description is illustrative in nature and that many modifications and variations thereof will be apparent to those skilled in the art having the benefit of these teachings. It is accordingly intended that the invention herein be defined solely by the claims appended hereto and that the claims be interpreted as broadly as permitted by the prior art.

We claim:

1. A line driver, comprising:

an input for receiving a Manchester-encoded digital data signal, the data signal comprising a series of positive and negative pulse levels representing digital HI and LO, respectively;

a wave-shaping circuit for converting the digital data signal into an analog signal, the wave-shaping circuit comprising:

a bank of n current sources $c_0$–$c_{n-1}$ with a combined output, each current source being scaled by a coefficient, each current source having switches controlled by a switching signal input $cnt_0$–$cnt_{n-1}$ for actuating the current sources in a selected sequence during each input data pulse, thereby generating as a combined output a staircase pulse signal with n steps for each input data pulse, wherein, when the Manchester-encoded input represents a binary sequence of all-ones or all-zeros data, the levels $a_k$ of the staircase pulse signal output approximate a sinusoidal curve $$a_k = \sin\left(2\pi f_o \cdot \frac{T}{2} \cdot \frac{k}{n}\right) = \sin\left(\frac{\pi k}{n}\right)$$

where k=0 to n−1, and where $$f_o = \frac{1}{T}$$

is the fundamental frequency of the input signal, wherein the coefficients $b_k$ used to scale the current sources are defined from the maximum peak value of the signal:

$$b_k = \sin\left(\frac{\pi}{2} + \frac{\pi k}{n}\right) - \sin\left(\frac{\pi}{2} + \frac{\pi(k+1)}{n}\right)$$

where k=0 to n−1,
wherein current sources $c_k$ are scaled as follows:

$$c_k = \frac{1}{2} b_k$$

for k=0 to n−1, and
wherein n=8 and wherein current sources $c_0$–$c_7$ are actuated sequentially in pairs starting from a positive or negative peak level of the input data, with pairs ($c_0$, $c_7$), ($c_1$, $c_6$), ($c_2$, $c_5$), and ($c_3$, $c_4$) being turned off sequentially in order followed by pairs ($c_3$, $c_4$), ($c_2$, $c_5$), ($c_1$, $c_6$), and ($c_0$, $c_7$) being turned on sequentially in order.

2. A line driver, comprising:

an input for receiving a Manchester-encoded digital data signal, the data signal comprising a series of HI and LO pulse levels, the data signal including an amplitude droop by an equalization weight α, when there are two consecutive repeated positive or negative pulse levels, during the second repeated pulse level;

a wave-shaping circuit for converting the digital data into an analog signal, the wave-shaping circuit comprising first and second sub-circuits, the first sub-circuit comprising a bank of n current sources $(1-\alpha)c_0$–$(1-\alpha)c_{n-1}$, each current source being scaled by a coefficient, each current source having a switch controlled by switching signals $cnt_{a0}$–$cnt_{a(n-1)}$ for actuating the current sources in a selected sequence, thereby generating a staircase pulse signal with n steps for each input data pulse; and the second sub-circuit comprising a bank of n current sources $(\alpha)c_0$–$(\alpha)c_{n-1}$, each current source being scaled by a coefficient, each current source having a switch controlled by switching signals $cnt_{b0}$–$cnt_{b(n-1)}$ for actuating the current sources in a selected sequence, thereby generating a staircase pulse signal with n steps for each input data pulse, wherein, when the Manchester-encoded pulse represent either all-ones or all-zeros data, the levels $a_k$ of the staircase pulse signal outputs $I_p$ and $I_n$ approximate a sinusoidal curve $$a_k = \sin\left(2\pi f_o \cdot \frac{T}{2} \cdot \frac{k}{n}\right) = \sin\left(\frac{\pi k}{n}\right)$$

where k=0 to n−1, and where $$f_o = \frac{1}{T}$$

is the fundamental frequency of the input signal,
wherein current sources $c_k$ are scaled as follows:

$$c_k = \frac{1}{2} b_k$$

for k=0 to n−1,
wherein n=8 and wherein current sources $(1-\alpha)c_0$–$(1-\alpha)c_7$ and $\alpha c_0$–$\alpha c_7$ are respectively actuated by switching signals $cnt_{a0}$–$cnt_{a7}$ and $cnt_{b0}$–$cnt_{b7}$, and wherein when the level of the input data pulse signal switches from the previous level to an opposite level, all control signals in the first and second sub-circuits are high and the switching signals are actuated in the following sequence where ↑ and ↓ represent, respectively, a switch turning on or off:

($cnt_{a0}$, $cnt_{a7}$)↓, ($cnt_{a1}$, $cnt_{a6}$)↓, ($cnt_{a2}$, $cnt_{a5}$)↓, ($cnt_{a3}$, $cnt_{a4}$)↓, ($cnt_{a3}$, $cnt_{a4}$)↑, ($cnt_{a2}$, $cnt_{a5}$)↑, ($cnt_{a1}$, $cnt_{a6}$)↑, ($cnt_{a0}$, $cnt_{a7}$)↑ with every control signal in the second sub-circuit being identical to its counterpart in the first sub-circuit.

3. A line driver, comprising:

an input for receiving a Manchester-encoded digital data signal, the data signal comprising a series of HI and LO pulse levels, the data signal including an amplitude droop by an equalization weight α, when there are two consecutive repeated positive or negative pulse levels, during the second repeated pulse level;

a wave-shaping circuit for converting the digital data into an analog signal, the wave-shaping circuit comprising first and second sub-circuits, the first sub-circuit comprising a bank of n current sources $(1-\alpha)c_0$–$(1-\alpha)c_{n-1}$, each current source being scaled by a coefficient, each current source having a switch controlled by switching signals $cnt_{a0}$–$cnt_{a(n-1)}$ for actuating the current sources in a selected sequence, thereby generating a staircase pulse signal with n steps for each input data pulse; and the second sub-circuit comprising a bank of n current sources $(\alpha)c_0$–$(\alpha)c_{n-1}$, each current source being scaled by a coefficient, each current source having a switch controlled by switching signals $cnt_{b0}$–$cnt_{b(n-1)}$ for actuating the current sources in a selected sequence, thereby generating a staircase pulse signal with n steps for each input data pulse, wherein, when the Manchester-encoded pulse represent either all-ones or all-zeros data, the levels $a_k$ of the staircase pulse signal outputs $I_p$ and $I_n$ approximate a sinusoidal curve $$a_k = \sin\left(2\pi f_o \cdot \frac{T}{2} \cdot \frac{k}{n}\right) = \sin\left(\frac{\pi k}{n}\right)$$

where k=0 to n−1, and where $$f_o = \frac{1}{T}$$

is the fundamental frequency of the input signal,
wherein current sources $c_k$ are scaled as follows:

$$c_k = \frac{1}{2}b_k$$

for k=0 to n−1, wherein n=8 and wherein current sources $(1-\alpha)c_0$–$(1-\alpha)c_7$ and $\alpha c_0$–$\alpha c_7$ are respectively actuated by switching signals $cnt_{a0}$–$cnt_{a7}$ and $cnt_{b0}$–$cnt_{b7}$, and wherein when the level of the input data pulse signal is the same as the previous one, all control signals in the first and second sub-circuits are high and the switching signals are actuated in the following sequence:

$cnt_{b7}\downarrow$, $cnt_{b6}\downarrow$, $cnt_{b5}\downarrow$, $cnt_{b4}\downarrow$, $cnt_{b3}\downarrow$, $cnt_{b2}\downarrow$, $cnt_{b1}\downarrow$, $cnt_{b0}\downarrow$, $(cnt_{a0}, cnt_{a7})\downarrow$, $(cnt_{a1}, cnt_{a6})\downarrow$, $(cnt_{a2}, cnt_{a5})\downarrow$, $(cnt_{a3}, cnt_{a4})\downarrow$.

4. A line driver, comprising:

an input for receiving a Manchester-encoded digital data signal, the data signal comprising a series of HI and LO pulse levels, the data signal including an amplitude droop by an equalization weight $\alpha$, when there are two consecutive repeated positive or negative pulse levels, during the second repeated pulse level;

a wave-shaping circuit for converting the digital data into an analog signal, the wave-shaping circuit comprising first and second sub-circuits, the first sub-circuit comprising a bank of n current sources $(1-\alpha)c_0$–$(1-\alpha)c_{n-1}$, each current source being scaled by a coefficient, each current source having a switch controlled by switching signals $cnt_{a0}$–$cnt_{a(n-1)}$ for actuating the current sources in a selected sequence, thereby generating a staircase pulse signal with n steps for each input data pulse; and the second sub-circuit comprising a bank of n current sources $(\alpha)c_0$–$(\alpha)c_{n-1}$, each current source being scaled by a coefficient, each current source having a switch controlled by switching signals $cnt_{b0}$–$cnt_{b(n-1)}$ for actuating the current sources in a selected sequence, thereby generating a staircase pulse signal with n steps for each input data pulse, wherein, when the Manchester-encoded pulse represent either all-ones or all-zeros data, the levels $a_k$ of the staircase pulse signal outputs $I_p$ and $I_n$ approximate a sinusoidal curve $$a_k = \sin\left(2\pi f_o \cdot \frac{T}{2} \cdot \frac{k}{n}\right) = \sin\left(\frac{\pi k}{n}\right)$$

where k=0 to n−1, and where $$f_o = \frac{1}{T}$$

is the fundamental frequency of the input signal,
wherein current sources $c_k$ are scaled as follows:

$$c_k = \frac{1}{2}b_k$$

for k=0 to n−1, wherein n=8 and wherein current sources $(1-\alpha)c_0$–$(1-\alpha)c_7$ and $\alpha c_0$–$\alpha c_7$ are respectively actuated by switching signals $cnt_{a0}$–$cnt_{a7}$ and $cnt_{b0}$–$cnt_{b7}$, and wherein when the level of the input data pulse signal travels from zero to a peak value, all control signals in the first and second sub-circuits start at a zero level and are actuated in the following sequence where $\uparrow$ and $\downarrow$ represent, respectively, a switch turning on or off:

$(cnt_{a0}, cnt_{b0})\uparrow$, $(cnt_{a1}, cnt_{b1})\uparrow$, $(cnt_{a2}, cnt_{b2})\uparrow$, $(cnt_{a3}, cnt_{b3})\uparrow$, $(cnt_{a4}, cnt_{b4})\uparrow$, $(cnt_{a5}, cnt_{b5})\uparrow$, $(cnt_{a6}, cnt_{b6})\uparrow$, $(cnt_{a7}, cnt_{b7})\uparrow$.

5. A line driver, comprising:

an input for receiving a Manchester-encoded digital data signal, the data signal comprising a series of HI and LO pulse levels, the data signal including an amplitude droop by an equalization weight $\alpha$, when there are two consecutive repeated positive or negative pulse levels, during the second repeated pulse level;

a wave-shaping circuit for converting the digital data into an analog signal, the wave-shaping circuit comprising first and second sub-circuits, the first sub-circuit comprising a bank of n current sources $(1-\alpha)c_0$–$(1-\alpha)c_{n-1}$, each current source being scaled by a coefficient, each current source having a switch controlled by switching signals $cnt_{a0}$–$cnt_{a(n-1)}$ for actuating the current sources in a selected sequence, thereby generating a staircase pulse signal with n steps for each input data pulse; and the second sub-circuit comprising a bank of n current sources $(\alpha)c_0$–$(\alpha)c_{n-1}$, each current source being scaled by a coefficient, each current source having a switch controlled by switching signals $cnt_{b0}$–$cnt_{b(n-1)}$ for actuating the current sources in a selected sequence, thereby generating a staircase pulse signal with n steps for each input data pulse, wherein, when the Manchester-encoded pulse represent either all-ones or all-zeros data, the levels $a_k$ of the staircase pulse signal outputs $I_p$ and $I_n$ approximate a sinusoidal curve $$a_k = \sin\left(2\pi f_o \cdot \frac{T}{2} \cdot \frac{k}{n}\right) = \sin\left(\frac{\pi k}{n}\right)$$

where k=0 to n−1, and where $$f_o = \frac{1}{T}$$

is the fundamental frequency of the input signal, wherein current sources $c_k$ are scaled as follows:

$$c_k = \frac{1}{2} b_k$$

for k=0 to n−1,
wherein n=8 and wherein current sources $(1-\alpha)c_0$–$(1-\alpha)c_7$ and $\alpha c_0$–$\alpha c_7$ are respectively actuated by switching signals $cnt_{a0}$–$cnt_{a7}$ and $cnt_{b0}$–$cnt_{b7}$, and
wherein when the level of the input data pulse signal travels from a peak value to zero, all of the control signals in the first and second sub-circuits are at a peak value and are actuated in the following sequence where ↑ and ↓ represent, respectively, a switch turning on or off:

$(cnt_{a7}, cnt_{b7})↑$, $(cnt_{a6}, cnt_{b6})↑$, $(cnt_{a5}, cnt_{b5})↑$, $(cnt_{a4}, cnt_{b4})↑$, $(cnt_{a3}, cnt_{b3})↑$, $(cnt_{a2}, cnt_{b2})↑$, $(cnt_{a1}, cnt_{b1})↑$, $(cnt_{a0}, cnt_{b0})↑$.

6. A line driver, comprising:
an input for receiving a Manchester-encoded digital data signal;
a wave-shaping circuit for converting the digital data signal into an analog signal, the wave-shaping circuit comprising:
a bank of current sources being scaled according to a set of coefficients and sequentially actuated in predetermined pairs to generate as a combined output a staircase pulse approximating a sinusoidal curve in response to an all-ones Manchester-encoded data signal input;
a smoothing filter for converting the staircase pulse signal into an analog signal.

7. The line driver of claim 6, wherein the current sources are numbered and paired sequentially beginning with the lowest-numbered current source being paired with the highest-numbered current source and proceeding inwards towards the middle-numbered current sources.

8. The line driver of claim 7, wherein the bank of numbered current sources includes eight current sources numbered $c_0$–$c_7$ and the current sources are actuated sequentially in pairs starting from a peak level of the input data, with pairs $(c_0, c_7)$, $(c_1, c_6)$, $(c_2, c_5)$, and $(c_3, c_4)$ being turned off sequentially in order followed by pairs $(c_3, c_4)$, $(c_2, c_5)$, $(c_1, c_6)$, and $(c_0, c_7)$ being turned on sequentially in order.

9. A line driver, comprising:
an input for receiving a Manchester-encoded digital data signal;
a wave-shaping circuit for converting the digital data into an analog signal, the wave-shaping circuit comprising:
a first sub-circuit comprising a first bank of current sources scaled according to a first set of coefficients and sequentially actuated in predetermined pairs to generate as a combined output a first staircase pulse signal, and
second sub-circuit comprising a second bank of current sources scaled according to a second set of coefficients and sequentially actuated in predetermined pairs to generate as a combined output a second staircase pulse signal,
the first and second set of coefficients having values such that the steps in the first and second staircase pulse signal outputs have respective levels approximating a sinusoidal curve scaled, respectively, by $(1-\alpha)$ and $\alpha$ in response to an all-ones Manchester-encoded data signal input, where 1 is a normalized output value and $\alpha$ is a pre-equalization weight.

10. The line driver of claim 9, wherein the first and second banks of current sources each include eight current sources actuated, respectively, by switching signals $cnt_{a0}$–$cnt_{a7}$ and $cnt_{b0}$–$cnt_{b7}$.

11. The line driver of claim 10, wherein when the level of the input data pulse signal switches from the previous level to the opposite level, all control signals in the first and second sub-circuits are high and the switching signals are actuated in the following sequence where ↑ and ↓ represent, respectively, a switch turning on or off:

$(cnt_{a0}, cnt_{a7})↓$, $(cnt_{a1}, cnt_{a6})↓$, $(cnt_{a2}, cnt_{a5})↓$, $(cnt_{a3}, cnt_{a4})↓$, $(cnt_{a3}, cnt_{a4})↑$, $(cnt_{a2}, cnt_{a5})↑$, $(cnt_{a1}, cnt_{a6})↑$, $(cnt_{a0}, cnt_{a7})↑$ with every control signal in the second sub-circuit being identical to its counterpart in the first sub-circuit.

12. The line driver of claim 10, wherein when the level of the input data pulse signal is the same as the previous one, all control signals in the first and second sub-circuits are high and the switching signals are actuated in the following sequence:

$cnt_{b7}↓$, $cnt_{b6}↓$, $cnt_{b5}↓$, $cnt_{b4}↓$, $cnt_{b3}↓$, $cnt_{b2}↓$, $cnt_{b1}↓$, $cnt_{b0}↓$, $(cnt_{a0}, cnt_{a7})↓$, $(cnt_{a1}, cnt_{a6})↓$, $(cnt_{a2}, cnt_{a5})↓$, $(cnt_{a3}, cnt_{a4})↓$.

13. The line driver of claim 10, wherein when the level of the input data pulse signal travels from zero to a peak value, all control signals in the first and second sub-circuits start at a zero level and are actuated in the following sequence where ↑ and ↓ represent, respectively, a switch turning on or off:

$(cnt_{a0}, cnt_{b0})↑$, $(cnt_{a1}, cnt_{b1})↑$, $(cnt_{a2}, cnt_{b2})↑$, $(cnt_{a3}, cnt_{b3})↑$, $(cnt_{a4}, cnt_{b4})↑$, $(cnt_{a5}, cnt_{b5})↑$, $(cnt_{a6}, cnt_{b6})↑$, $(cnt_{a7}, cnt_{b7})↑$.

14. The line driver of claim 10, wherein when the level of the input data pulse signal travels from a peak value to zero, all of the control signals in the first and second sub-circuits are at a level corresponding to the peak value and are actuated in the following sequence where ↑ and ↓ represent, respectively, a switch turning on or off:

$(cnt_{a7}, cnt_{b7})↓$, $(cnt_{a6}, cnt_{b6})↓$, $(cnt_{a5}, cnt_{b5})↓$, $(cnt_{a4}, cnt_{b4})↓$, $(cnt_{a3}, cnt_{b3})↓$, $(cnt_{a2}, cnt_{b2})↓$, $(cnt_{a1}, cnt_{b1})↓$, $(cnt_{a0}, cnt_{b0})↓$.

15. A line driver, comprising:
an input for receiving a Manchester-encoded digital data signal;
an FIR filter for shaping the digital data signal, the FIR filter including:
a first bank of current sources scaled according to a first set of coefficients and sequentially actuated to generate as a combined output a first signal approximating a sinusoidal waveform having a peak value of $(1-\alpha)$ in response to an all-ones Manchester-encoded digital data signal input, where 1 is a normalized output value, and where $\alpha$ is a pre-equalization weight, and a second bank of current sources scaled according to a second set of coefficients and sequentially actuated to generate as a combined output a second signal approximating a sinusoidal waveform having a peak value of $\alpha$ in response to an all-ones Manchester-encoded digital data signal input; and a smoothing filter for converting the sum of the first and second signals into a continuous waveform analog output, wherein when two consecutive identical input pulses are received:

the first signal makes a sinusoidal peak-to-peak transition during the first of the two consecutive identical input pulses, and then holds the peak value for the second consecutive input pulse; and the second signal has a zero value during the first half of the first input pulse followed by a sinusoidal zero-to-peak transition during the second half of the first input pulse, and then a sinusoidal peak-to-zero transition during the second input pulse, whereby when the first and second signals are summed, the resulting signal exhibits an amplitude droop by the pre-equalization weight $\alpha$.

16. A method for converting a Manchester-encoded digital data signal into an analog signal, comprising:

scaling a bank of current sources according to a set of coefficients having values such that in response to an all-ones Manchester-encoded digital data signal input, the current sources are actuated sequentially in predetermined pairs to generate as a combined output a staircase pulse signal approximating a sinusoidal curve;

actuating the current sources in a predetermined sequence in response to a Manchester-encoded digital data signal input;

converting the resulting staircase pulse signal output into an analog signal.

17. The method of claim 16, wherein there are eight scaled current sources numbered $c_0$–$c_7$ and wherein the current sources are actuated sequentially in pairs starting from a peak level of the input data, with pairs $(c_0, c_7)$, $(c_1, c_6)$, $(c_2, c_5)$, and $(c_3, c_4)$ being turned off sequentially in order followed by pairs $(c_3, c_4)$, $(c_2, c_5)$, $(c_1, c_6)$, and $(c_0, c_7)$ being turned on sequentially in order.

18. A method for converting a Manchester-encoded digital data signal into an analog signal, comprising:

(a) scaling a first bank of current sources in a first sub-circuit according to a first set of coefficients;

(b) scaling a second bank of current sources in a second sub-circuit according to a second set of coefficients, the first and second set of coefficients having values such that in response to an all-ones Manchester-encoded digital input signal, the first and second banks of current sources are actuated sequentially to generate first and second staircase pulse signals, the steps in the first and second staircase pulse signals having respective levels approximating a sinusoidal curve scaled, respectively, by $(1-\alpha)$ $\alpha_k$, and $(\alpha)$ $\alpha_k$, where 1 is a normalized output value and $\alpha$ is a pre-equalization weight;

(c) actuating the first and second bank of current sources in a predetermined sequence in response to a Manchester-encoded digital signal input;

(d) summing the first and second staircase pulse signals;

(e) converting the summed staircase pulse signals into an analog signal.

19. The method of claim 18, wherein each of the first and second bank of current sources includes eight current sources numbered $(1-\alpha)c_0$–$(1-\alpha)c_7$ and $\alpha c_0$–$\alpha c_7$ that are respectively actuated by switching signals $cnt_{a0}$–$cnt_{a7}$ and $cnt_{b0}$–$cnt_{b7}$.

20. The method of claim 18, wherein when the level of the input data pulse signal switches from the previous level to the opposite level, all control signals in the first and second sub-circuits are high and the switching signals are actuated in the following sequence where $\uparrow$ and $\downarrow$ represent, respectively, a switch turning on or off:

$(cnt_{a0}, cnt_{a7})\downarrow$, $(cnt_{a1}, cnt_{a6})\downarrow$, $(cnt_{a2}, cnt_{a5})\downarrow$, $(cnt_{a3}, cnt_{a4})\downarrow$, $(cnt_{a3}, cnt_{a4})\uparrow$, $(cnt_{a2}, cnt_{a5})\uparrow$, $(cnt_{a1}, cnt_{a6})\uparrow$, $(cnt_{a0}, cnt_{a7})\uparrow$ with every control signal in the second sub-circuit being identical to its counterpart in the first sub-circuit.

21. The method of claim 18, wherein when the level of the input data pulse signal is the same as the previous one, all control signals in the first and second sub-circuits are high and the switching signals are actuated in the following sequence:

$cnt_{b7}\downarrow$, $cnt_{b6}\downarrow$, $cnt_{b5}\downarrow$, $cnt_{b4}\downarrow$, $cnt_{b3}\downarrow$, $cnt_{b2}\downarrow$, $cnt_{b1}\downarrow$, $cnt_{b0}\downarrow$, $(cnt_{a0}, cnt_{a7})\downarrow$, $(cnt_{a1}, cnt_{a6})\downarrow$, $(cnt_{a2}, cnt_{a5})\downarrow$, $(cnt_{a3}, cnt_{a4})\downarrow$.

22. The method of claim 18, wherein when the level of the input data pulse signal travels from zero to a peak value, all control signals in the first and second sub-circuits start at a zero level and are actuated in the following sequence where $\uparrow$ and $\downarrow$ represent, respectively, a switch turning on or off:

$(cnt_{a0}, cnt_{b0})\uparrow$, $(cnt_{a1}, cnt_{b1})\uparrow$, $(cnt_{a2}, cnt_{b2})\uparrow$, $(cnt_{a3}, cnt_{b3})\uparrow$, $(cnt_{a4}, cnt_{b4})\uparrow$, $(cnt_{a5}, cnt_{b5})\uparrow$, $(cnt_{a6}, cnt_{b6})\uparrow$, $(cnt_{a7}, cnt_{b7})\uparrow$.

23. The method of claim 18, wherein when the level of the input data pulse signal travels from a peak value to zero, all of the control signals in the first and second sub-circuits are at a value corresponding to a peak level and are actuated in the following sequence where $\uparrow$ and $\downarrow$ represent, respectively, a switch turning on or off:

$(cnt_{a7}, cnt_{b7})\downarrow$, $(cnt_{a6}, cnt_{b6})\downarrow$, $(cnt_{a5}, cnt_{b5})\downarrow$, $(cnt_{a4}, cnt_{b4})\downarrow$, $(cnt_{a3}, cnt_{b3})\downarrow$, $(cnt_{a2}, cnt_{b2})\downarrow$, $(cnt_{a1}, cnt_{b1})\downarrow$, $(cnt_{a0}, cnt_{b0})\downarrow$.

24. A method for converting a Manchester-encoded digital data signal having an all-ones fundamental frequency $f_0$ into an analog signal, comprising:

scaling a first bank of current sources according to a first set of coefficients having values such that when the first bank of current sources is actuated in a predetermined sequence in response to an all-ones Manchester-encoded digital data signal input, the first bank of current sources produces as a combined output a signal (t) approximating a sinusoidal waveform having the fundamental frequency $f_0$ and a peak value of $1-\alpha$, where 1 is a normalized output value, and where $\alpha$ is a pre-equalization weight, and scaling a second bank of current sources according to a second set of coefficients having values such that when the second bank of current sources is actuated in a predetermined sequence in response to an all-ones Manchester-encoded digital data signal input, the second bank of current sources produces as a combined output a second signal b(t) approximating a sinusoidal waveform having the fundamental frequency $f_0$ and a peak value of $\alpha$;

when two consecutive identical input pulses are received:
actuating the first bank of current sources such that signal a(t) makes a sinusoidal peak-to-peak transition during the first of the two consecutive identical input pulses, and then holds the peak value for the second consecutive input pulse; and actuating the second bank of current sources such that signal b(t) has a zero value during the first half of the first input pulse followed by a sinusoidal zero-to-peak transition during the second half of the first input pulse, and then a sinusoidal peak-to-zero transition during the second input pulse, whereby when signals a(t) and b(t) are summed, the resulting signal exhibits an amplitude droop by the pre-equalization weight $\alpha$.

* * * * *